United States Patent
Kessel et al.

(10) Patent No.: US 11,757,610 B1
(45) Date of Patent: Sep. 12, 2023

(54) LOW PHASE NOISE CLOCK RECOVERY OVER A DATA CONNECTION

(71) Applicant: NXP B.V., Eindhoven (NL)

(72) Inventors: Martin Kessel, Pannewitz (DE); Andreas Johannes Gerrits, Oeffelt (NL); Sebastian Bohn, Dresden (DE); Prince Thomas, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/659,651

(22) Filed: Apr. 18, 2022

(51) Int. Cl.
*H04L 7/00* (2006.01)
*H03L 7/085* (2006.01)

(52) U.S. Cl.
CPC ............ *H04L 7/0008* (2013.01); *H03L 7/085* (2013.01)

(58) Field of Classification Search
CPC .............................. H04L 7/0008; H03L 7/085
See application file for complete search history.

(56) References Cited

U.S. PATENT DOCUMENTS

| | | | | |
|---|---|---|---|---|
| 5,579,004 A * | 11/1996 | Linz | ................. | G06F 7/026 341/144 |
| 6,047,073 A * | 4/2000 | Norris | ................. | G06F 3/162 84/630 |
| 6,058,066 A * | 5/2000 | Norris | ................. | H03K 23/68 365/230.05 |
| 6,246,774 B1 * | 6/2001 | Norris | ................. | G10H 1/0066 381/104 |
| 7,409,031 B1 * | 8/2008 | Lee | ................. | H03L 7/07 375/376 |
| 8,149,972 B2 | 4/2012 | Abbasfar et al. | | |
| 11,063,791 B2 | 7/2021 | Lin et al. | | |
| 11,085,994 B2 * | 8/2021 | Roger | ................. | G01S 13/931 |
| 2005/0238117 A1 * | 10/2005 | Washakowski | ........ | H04L 27/206 375/302 |
| 2006/0159430 A1 * | 7/2006 | Sugahara | ............ | H04N 9/8227 386/209 |
| 2013/0049767 A1 * | 2/2013 | King | ................. | G01R 31/58 324/605 |
| 2014/0133242 A1 * | 5/2014 | Oh | ................. | G11C 16/16 365/185.18 |
| 2017/0092344 A1 * | 3/2017 | Chae | ................. | G06F 13/4243 |

(Continued)

FOREIGN PATENT DOCUMENTS

| | | | | | |
|---|---|---|---|---|---|
| CN | 113078899 A | * | 7/2021 | ............. | G06F 1/04 |
| CN | 115114209 A | * | 9/2022 | ......... | H04L 25/0278 |
| GB | 2542579 A | * | 3/2017 | ............. | H04S 5/00 |

*Primary Examiner* — Adam D Houston (57) ABSTRACT

A system includes a first integrated circuit device, a second integrated circuit device, and a reference clock provided to the first and second integrated circuit devices. The first integrated circuit device detects a first edge of a first clock utilized by the first integrated circuit device, detects a second edge of the first clock, determines a first count of cycles of the reference clock between the first edge and the second edge, and communicates the first count to the second integrated circuit device. The second integrated circuit device receives the first count, provides a third edge of a second clock utilized by the second integrated circuit device, determines that a first number of cycles of the reference clock since providing the third edge is equal to the first count, and provides a fourth edge of the second clock in response to determining that the first number of cycles is equal to the first count.

20 Claims, 5 Drawing Sheets

(56) References Cited

U.S. PATENT DOCUMENTS

| | | | |
|---|---|---|---|
| 2017/0168520 A1* | 6/2017 | Yu | G06F 1/14 |
| 2017/0228327 A1* | 8/2017 | Mishra | G06F 13/4282 |
| 2022/0404858 A1* | 12/2022 | Lu | G06F 1/08 |
| 2023/0033643 A1* | 2/2023 | Chada | H04B 3/46 |

* cited by examiner

LOW PHASE NOISE CLOCK RECOVERY OVER A DATA CONNECTION

FIELD OF THE DISCLOSURE

This disclosure generally relates to clock synchronization in a system, and more particularly relates to providing low phase noise clock recovery over a data connection.

BACKGROUND

Various types of systems operate with elements distributed across a number of components that my reside on separate integrated circuits (ICs) on a printed circuit board (PCB) or even across a number of devices in remote geographic locations. Such systems may need to be synchronized to a clock that is common to the distributed components of the system. An example may include the synchronization of phase-locked loops (PLLs) in the various ICs of a radar system, a radio communication system, or the like. Here, the synchronization to the common clock may be provided by sending dedicated wires or traces from a first component that generates the clock to the distributed components of the system. In this way, the distributed components can synchronize their operations to the generated clock. However, the provision of dedicated wires or traces for clock synchronization adds to the complexity of the system, such as where a PCB with limited board space must dedicate a portion of the board space to the routing of the clock synchronization signals between the components. Moreover, where high precision synchronization is needed, care must be taken to assure that the synchronization signal reaches all applicable components in phase with the other components, making the routing of such synchronization signal traces a challenge. There may further be a need to account for phase differences between the generated clock in the first component, and the clock synchronization signals as received by the down-stream components.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The description will focus on specific implementations and embodiments of the teachings. This focus is provided to assist in describing the teachings, and should not be interpreted as a limitation on the scope or applicability of the teachings. Moreover, other teachings can be used in association with the teachings of this application, as needed or desired, without limiting the scope of the teachings herein.

In a particular embodiment, a system may include a first integrated circuit device, a second integrated circuit device, and a reference clock provided to the first and second integrated circuit devices. The first integrated circuit device may detect a first edge of a first clock utilized by the first integrated circuit device, detect a second edge of the first clock, determine a first count of cycles of the reference clock between the first edge and the second edge, and communicate the first count to the second integrated circuit device. The second integrated circuit device may receive the first count, provide a third edge of a second clock utilized by the second integrated circuit device, determine that a first number of cycles of the reference clock since providing the third edge is equal to the first count, and provide a fourth edge of the second clock in response to determining that the first number of cycles is equal to the first count.

In another embodiment, method may include detecting, by a first integrated circuit device of a system, a first edge of a first clock utilized by the first integrated circuit device, detecting, by the first integrated circuit device, a second edge of the first clock, determining a first count of cycles of a reference clock between the first edge and the second edge, and communicating the first count to a second integrated circuit device. The method may further include receiving, by the second integrated circuit device, the first count, providing, by the second integrated circuit device, a third edge of a second clock utilized by the second integrated circuit device, determining, by the second integrated circuit device, that a first number of cycles of the reference clock since providing the third edge is equal to the first count, and providing, by the second integrated circuit device, a fourth edge of the second clock in response to determining that the first number of cycles is equal to the first count.

In yet another embodiment, a method for synchronizing clocks in integrated circuit devices, may include oversampling, in a first integrated circuit device, a first clock, providing, via a communication interface between the first integrated circuit device and a second integrated circuit device, a bit stream that includes information from the oversampling, and playing back, in the second integrated circuit device, a second clock based upon the information from the oversampling.

It has been understood by the inventors of the current disclosure that the various types of systems that need to be synchronized to a common clock often include a high-speed data interfaces between the components of the system. Such high-speed data interfaces typically provide a common reference clock between the components for the operation of the high-speed interface, or for other operations of the components. In the current disclosure, high-speed data interfaces are utilized to send timing information between the components. The timing information relates the clock to be synchronized (hereinafter the "signal clock") to the common reference clock. The timing information is then utilized by the components to generate the signal clock on the components, without the use of dedicated synchronization wires or traces between the components.

Figure 1:
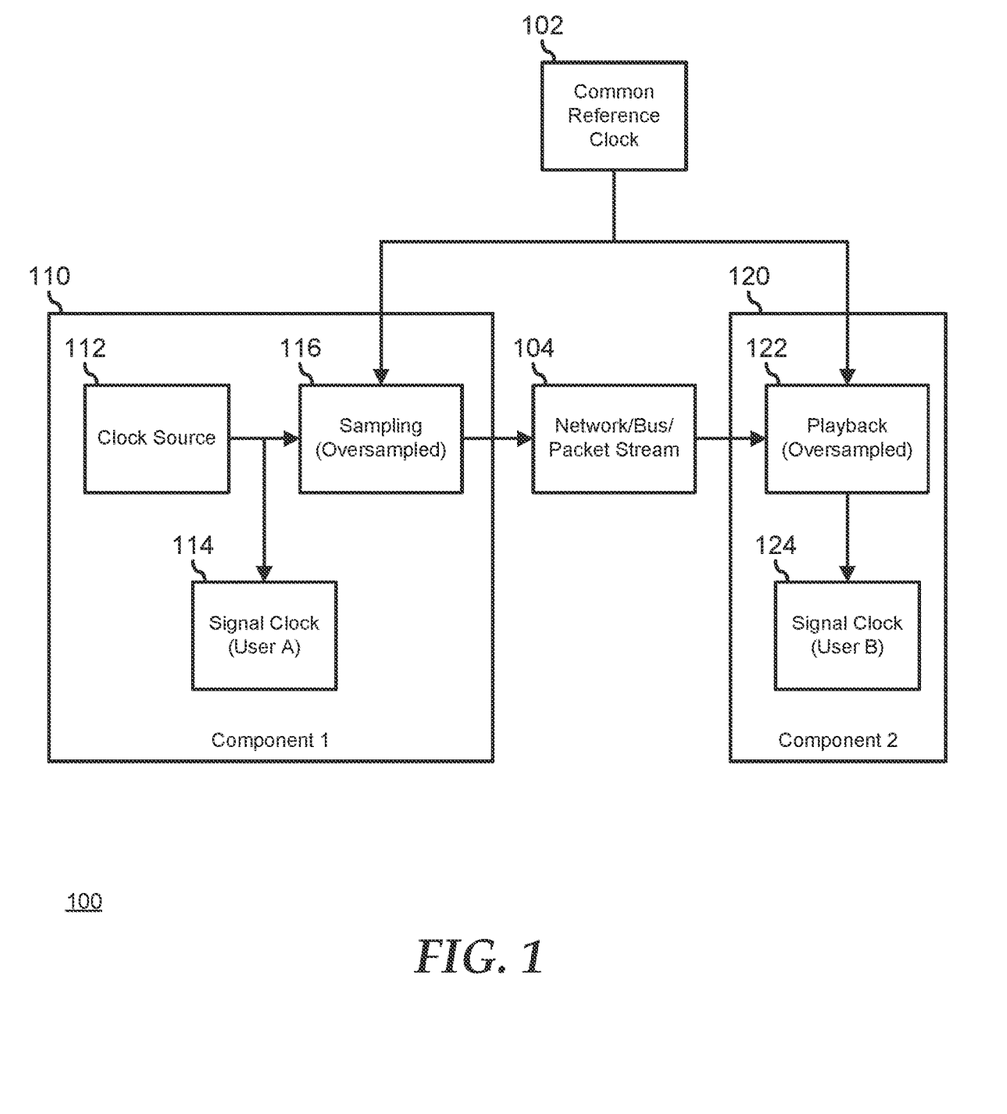
FIG. 1 is a block diagram illustrating a system for providing low phase noise clock recovery over a data connection according to an embodiment of the current disclosure.

FIG. 1 illustrates a system 100 including a common reference clock 102, a communication interface 104, a first component 110, and a second component 120. System 100 represents a system that operates with elements distributed across components 110 and 120. As such, components 110 and 120 may represent separate ICs on a PCB or may represent devices in remote geographic locations as needed or desired. Component 110 includes a clock source 112, a signal clock 114 that is based upon the clock source, and a sampling module 116. Here, clock source 112 is represented as being included in component 110, but this is not necessarily so, and the clock source may be separate from component 110 as needed or desired. For example, clock source 112 may represent an external crystal or other external clock source that is utilized by component 110 to generate signal clock 114. Signal clock 114 may be utilized by component 110 for driving a PLL, or for otherwise clocking the operations of the component, as needed or desired. Component 120 includes a playback module 122 and a signal clock 124 that is recreated from the playback module. Signal clock 124 may be utilized by component 120 for driving a PLL, or for otherwise clocking the operations of the component, as needed or desired.

Here, it will be understood that signal clock 114 and signal clock 124 are configured to be synchronized to each other. In particular, signal clock 124 is configured to have a clock period that is the same as the clock period of signal clock 114. Further, signal clock 124 may be further configured to have a phase angle that is the same as the phase angle of signal clock 114, as needed or desired. Clock source 112 is oversampled by sampling module 116 to generate a bit-stream that is transmitted to component 120 via communication interface 104. The oversampled bit-stream is received by playback module 122 and utilized to generate signal clock 124. Here, without further information, signal clock 114 and signal clock 124 will each have a common clock period by virtue of the oversampling rate of sampling module 116 and of playback module 122. However, it may be seen that playback module 122 will create signal clock 124 with an inherent delay over signal clock 114.

In a particular embodiment, the phase delay between signal clock 114 and signal clock 124 may be corrected by providing additional timing information over and above the oversampled bit-stream. Thus, in a particular embodiment, component 110 operates to correlate a starting point of the oversampled bit-stream to a particular time signature based upon common reference clock 102. For example, component 110 may operate to determine a timestamp at which clock source 112 transitions from a low state to a high state, or vice versa, and may further provide the timestamp information to component 120 via communication interface 104. Here, component 120 operates to start the playback of the oversampled bit-stream at a time that corresponds to the timestamp information received from component 110. In this way, signal clock 114 and signal clock 124 can achieve clock phase synchronization in addition to clock period synchronization as described above. It will be understood that as the clock frequency increases or the oversampling rate increases, that the data bandwidth of communication interface 104 will also increase. This bandwidth increase on communication interface 104 may be undesirable in view of other data communication needs of system 100 for the communication interface. In another embodiment, one or both of components 110 and 120 may include a delay block configured to delay the associated signal clocks 114 and 124, as needed or desired. Here, such a delay block may be utilized to correct the delay between signal clock 114 and signal clock 124. In this regard, a test function may be utilized to characterize the delay between the generation of the sampled clock and the generation of the recreated clock, and the delay block can be programmed to compensate for the characterized delay.

Common reference clock 102 represents a clock source that is provided to both component 110 and component 120. In a particular embodiment, common reference clock 102 represents a clock source that is provided for communication interface 104, and that is utilized in clocking the communication interface. Here, common reference clock 102 need not be a separate hardware clock, but may be a clocking mechanism that is integrated into the signaling provided on communication interface 104, such as where a data encoding scheme on the communication interface permits the transmission of the clock signal by component 110 along with the data stream, and the recovery of the clock signal by component 120. In another embodiment, common reference clock 102 represents a universal time base clock, such as a time base provided by a Global Positioning System (GPS) or the like. Communication interface 104 represents any data communication interface as needed or desired, including a processing system-level data communication interface, such as a PCIe interface, a USB interface, a proprietary processing system-level interface, or the like, an area-level data communication interface, such as a LAN or WAN interface like Ethernet or FibreChannel interfaces, wireless interfaces, or the like, or any other type of data communication interface capable of transmitting the timing information as described herein, such as network packets, bus transactions, bit-streams, or the like. As used herein, sampling module 116 and playback module 122 may represent hardware signal processing devices, software signal processing applications, or a combination of hardware and software, as needed or desired.

Figure 2:
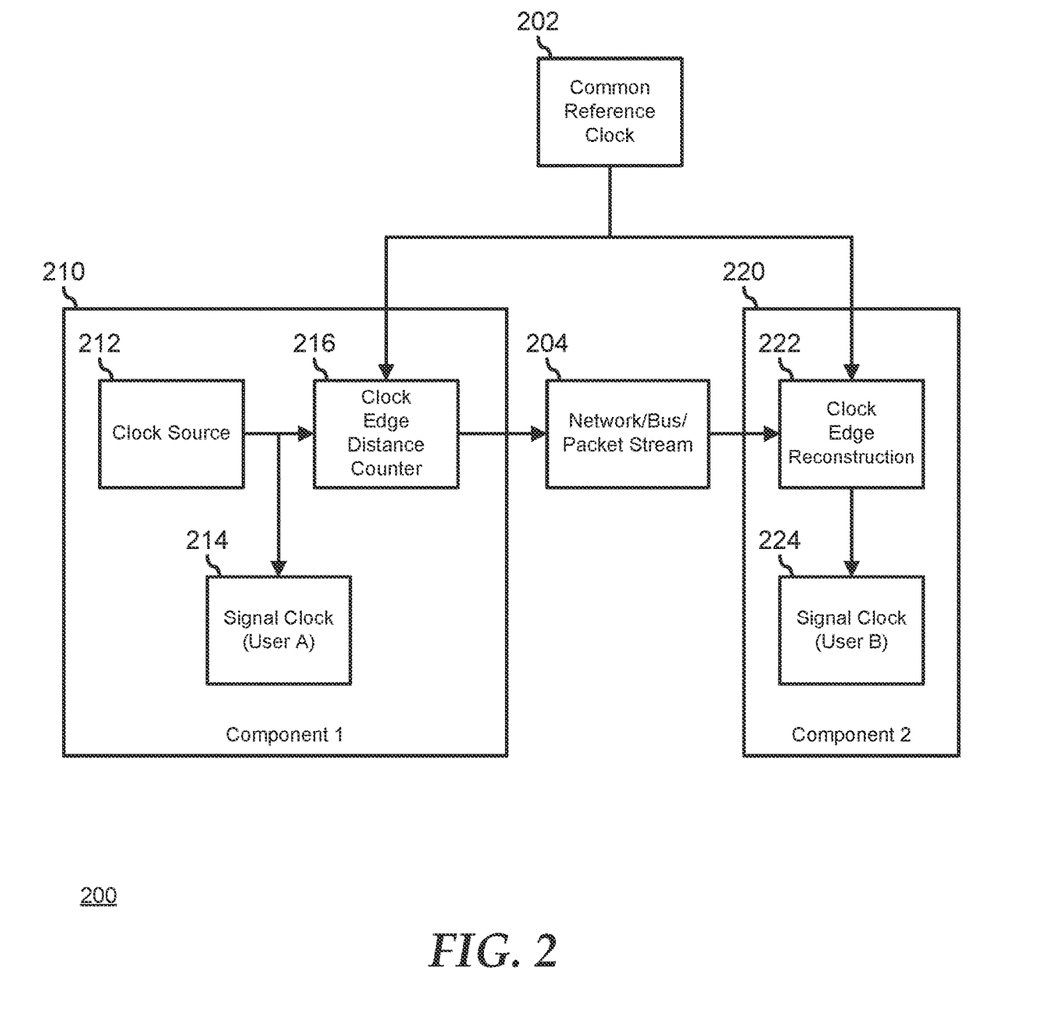
FIG. 2 is a block diagram illustrating a system for providing low phase noise clock recovery over a data connection according to another embodiment of the current disclosure.

In a particular embodiment, a data stream which contains distance values for the clock edges of a clock source with respect to a common reference clock is provided instead of the oversampled bit-stream. FIG. 2 illustrates a system 200, including a common reference clock 202, a communication interface 204, a first component 210, and a second component 220. System 200 is similar to system 100, and represents a system that operates with elements distributed across components 210 and 220. Component 210 includes a clock source 212, a signal clock 214 that is based upon the clock source, and a clock edge distance counter module 216. Clock source 212 is similar to clock source 112, and can be included in component 210, or may be separate from the component as needed or desired. Signal clock 214 may be utilized by component 210 for driving a PLL, or for otherwise clocking the operations of the component, as needed or desired. Component 220 includes a clock edge reconstruction module 222 and a signal clock 224 that is recreated from the clock edge reconstruction module. Signal clock 224 may be utilized by component 220 for driving a PLL, or for otherwise clocking the operations of the component, as needed or desired.

Here, it will be understood that signal clock 214 and signal clock 224 are configured to be synchronized to each other. In particular, signal clock 224 is configured to have a clock period that is the same as the clock period of signal clock 214, and to have a phase angle that is the same as the phase angle of signal clock 214. A clock edge of clock source 212 (a rising or a falling of the clock signal) is detected by clock edge distance counter module 216 and the clock edge distance counter module counts a number of cycles of common reference clock 202 until a next clock edge of the clock source is detected. Timing information including the number of cycles is then communicated by clock edge distance counter module 216 to component 220 via communication interface 204. The timing information is received by clock edge reconstruction module 222, and the clock edge reconstruction module provides an edge pulse and begins a countdown of the number of cycles of common reference clock 202 before providing another edge pulse. The edge pulses are then utilized by component 220 to recreate signal clock 224. Here, the recreation of signal clocks from edge pulses is known in the art, and will not be further described herein except as needed to illustrate the current embodiments.

In another embodiment, clock edge distance counter module 216 operates to detect an edge of signal clock 214 (either a rising edge or a falling edge), counts the number of cycles of common reference clock 202 until a next clock edge of the clock source is detected, and sends timing information including the number of cycles to component 220 as described above. However, here, on subsequent cycles, clock edge distance counter module 216 again counts the number of cycles of common reference clock until the next clock edge of the clock source, but then sends timing information that includes a number of cycles that the subsequent cycle differed from the previous number. In one case, the initial number of cycles sets a base number, and subsequent counts include a difference between the base number an all subsequent counts. For example, if clock edge distance counter module 216 detects a count sequence as follows: 124, 122, 124, 125, 124 . . . , then the timing information would be: 124 (the base number), −2, 0, 1, 0, . . . . In another case, each subsequent count establishes a new base count. Here, the above count sequence (124, 122, 124, 125, 124, . . . ) would be encoded: 124, −2 (the difference from 124), 2 (the difference from 122), 1 (the difference from 124), −1 (the difference from 125), . . . .

In a particular embodiment, clock edge distance counter module 216 operates to distinguish between a rising edge of signal clock 214 and a falling edge of the signal clock. Here, clock edge distance counter module 216 operates to provide a first count between a rising edge of signal clock 214 and a subsequent falling edge of the signal clock, and to provide a second count between the falling edge of the signal clock and a subsequent rising edge of the signal clock. Clock edge distance counter module 216 then sends first timing information including the first count to component 220, and sends second timing information including the second count to the component. In this embodiment, clock edge reconstruction module 222 operates to receive the first timing information, to provide a rising edge pulse, and to initiate a countdown of the first count before providing a falling edge pulse. Then clock edge reconstruction module 222 operates to receive the second timing information, to provide a falling edge pulse after the first count is counted down, and to initiate another countdown of the second count before providing a new rising edge pulse. In another case, clock edge reconstruction module 222 may operate to recreate signal clock 224 directly, by providing a high-signal output at the timing of the rising edge pulse, to wait the first countdown, and to then provide a low-signal output at the conclusion of the first countdown, and then to wait the second countdown before providing a renewed high-signal output. In this embodiment, it can be understood that signal clock 224 will not only recreate the clock period of signal clock 214, but also will recreate any clock edge jitter exhibited by signal clock 214.

It will be understood that synchronization of the clock edge jitter between components of a system may provide advantages over traditionally synchronized signal clocks, as needed or desired.

In a particular embodiment, clock edge distance counter module 216 operates continuously, detecting the edge distances on each successive clock cycle, and repeatedly sending the timing information to component 220 to recreate signal clock 224 based upon the continuous performance of signal clock 214. In this way, any clock drift or clock period drift exhibited by signal clock 214 is faithfully recreated on signal clock 224. On the other hand, where the bandwidth of communication interface 204 is seen to be limited, in another embodiment, clock edge distance counter module 216 operates to periodically sample signal clock 214, and to send the timing information on something less than a per-cycle basis. Here, clock edge reconstruction module 222 operates to recreate signal clock 224 based upon previously received timing information until such time as new timing information is received, as dictated by the operation of clock edge distance counter module 216. It will be further understood that signal clock 214 and signal clock 224 can be maintained in phase by including timestamp information in the timing information, as described above, as needed ore desired.

Common reference clock 202 represents a clock source that is provided to both component 210 and component 220, and may represent a clock source that is provided for communication interface 204, and that is utilized in clocking the communication interface. a universal time base clock, such as a time base provided by a Global Positioning System (GPS) or the like. Communication interface 204 represents any data communication interface as needed or desired, including a processing system-level data communication interface, such as a PCIe interface, a USB interface, a proprietary processing system-level interface, or the like, an area-level data communication interface, such as a LAN or WAN interface like Ethernet or FibreChannel interfaces, wireless interfaces, or the like, or any other type of data communication interface capable of transmitting the timing information as described herein, such as network packets, bus transactions, bit-streams, or the like. As used herein, clock edge distance counter module 216 and clock edge reconstruction module 222 may represent hardware signal processing devices, software signal processing applications, or a combination of hardware and software, as needed or desired.

Figure 3:
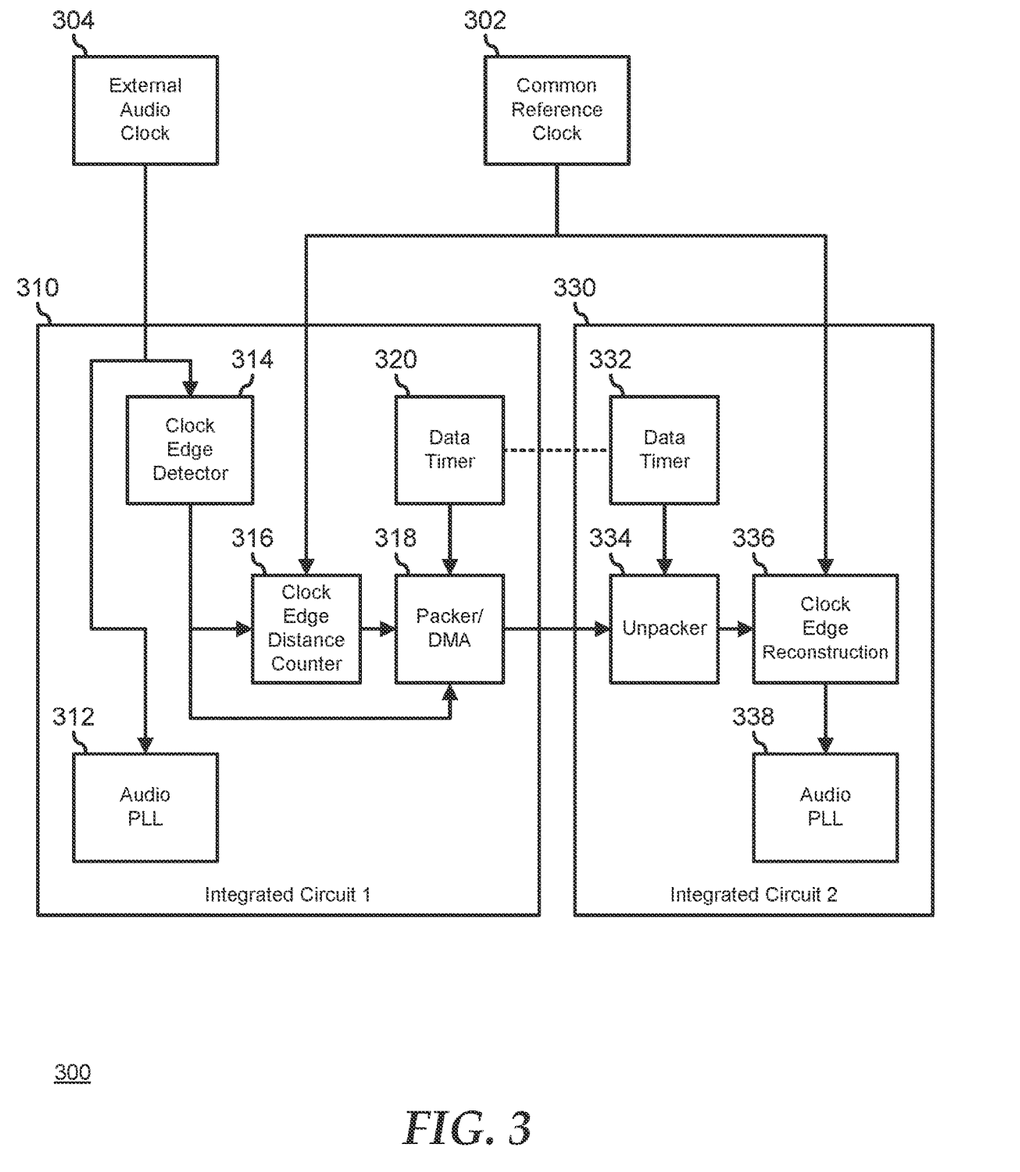
FIG. 3 is a block diagram illustrating a system for providing low phase noise clock recovery over a data connection according to another embodiment of the current disclosure.

FIG. 3 illustrates a radio system 300 similar to system 200. Radio system 300 includes a common reference clock 302, an external audio clock 304, a first radio IC 310, and a second radio IC 330. Radio system 300 represents a radio system that operates with elements distributed across radio ICs 310 and 330. Radio IC 310 includes an audio PLL 312 that is derived from external audio clock 304, a clock edge detector module 314, a clock edge distance counter module 316, a data packer/direct memory access (DMA) 318 (hereinafter "data packer 318"), and a data timer 320. External audio clock 304 is similar to clock source 212, and can be included in radio IC 210, or may be separate from the radio IC as needed or desired. Audio PLL 312 may be utilized by radio IC 310 for driving a PLL based off of external audio clock 304 or the PLL may be a stepped-up or stepped-down version of the external audio clock, as needed or desired. Further, external audio clock 304 may be provided for clocking other operations of the radio IC 310, as needed or desired. In a particular embodiment, external audio clock 304 provides a 200 kHz clock to radio IC 310, or another frequency clock, as needed or desired. Radio IC 330 includes a data timer 332 that is synchronized to data timer 320, a data unpacker 334, a clock edge reconstruction module 336, and an audio PLL 338 that is recreated from the clock edge reconstruction module.

Here, it will be understood that audio PLL 312 and audio PLL 338 are configured to be synchronized to each other. In particular, audio PLL 312 is configured to have a clock period that is the same as the clock period of audio PLL 338, and to have a phase angle that is the same as the phase angle of audio PLL 338. A clock edge of external audio clock 304 (a rising or a falling of the clock signal) is detected by clock edge detector module 314 and clock edge distance counter module 316 counts a number of cycles of common reference clock 302 until a next clock edge of the clock source is detected. Timing information including the number of cycles to the next clock edge is then communicated by clock edge distance counter module 316 to data packer 318 for communication via a communication interface to data unpacker 334. The timing information is provided to clock edge reconstruction module 336, and the clock edge reconstruction module provides an edge pulse and begins a countdown of the number of cycles of common reference clock 302 before providing another edge pulse. The edge pulses are then utilized by clock edge reconstruction module 336 to recreate audio PLL 338. Here, the recreation of audio PLLs from edge pulses is known in the art, and will not be further described herein except as needed to illustrate the current embodiments.

In a particular embodiment, clock edge distance counter module 316 operates to distinguish between a rising edge of external audio clock 304 and a falling edge of the external audio clock. Here, clock edge distance counter module 316 operates to provide a first count between a rising edge of external audio clock 304 and a subsequent falling edge of the external audio clock, and to provide a second count between the falling edge of the external audio clock and a subsequent rising edge of the external audio clock. Clock edge distance counter module 316 then sends first timing information including the first count to data packer 318, and sends second timing information including the second count to the data packer. In this embodiment, clock edge reconstruction module 336 operates to receive the first timing information, to provide a rising edge pulse, and to initiate a countdown of the first count before providing a falling edge pulse. Then clock edge reconstruction module 336 operates to receive the second timing information, to provide a falling edge pulse after the first count is counted down, and to initiate another countdown of the second count before providing a new rising edge pulse. In another case, clock edge reconstruction module 336 may operate to recreate audio PLL 338 directly, by providing a high-signal output at the timing of the rising edge pulse, to wait the first countdown, and to then provide a low-signal output at the conclusion of the first countdown, and then to wait the second countdown before providing a renewed high-signal output. In this embodiment, it can be understood that audio PLL 338 will not only recreate the clock period of audio PLL 312, but also will recreate any clock edge jitter exhibited by audio PLL 312. It will be understood that synchronization of the clock edge jitter between components of a system may provide advantages over traditionally synchronized signal clocks, as needed or desired.

In a particular embodiment, clock edge distance counter module 316 operates continuously, detecting the edge distances on each successive clock cycle, and repeatedly sending the timing information to clock edge reconstruction module 336 to recreate audio PLL 338 based upon the continuous performance of audio PLL 312. In this way, any clock drift or clock period drift exhibited by audio PLL 312 is faithfully recreated on audio PLL 338. On the other hand, where the bandwidth of the communication interface is seen to be limited, in another embodiment, clock edge distance counter module 316 operates to periodically sample external audio clock 304, and to send the timing information on something less than a per-cycle basis. Here, clock edge reconstruction module 336 operates to recreate audio PLL 338 based upon previously received timing information until such time as new timing information is received, as dictated by the operation of clock edge distance counter module 316. It will be further understood that audio PLL 312 and audio PLL 338 can be maintained in phase by including timestamp information in the timing information, as described above, as needed ore desired.

Common reference clock 302 represents a clock source that is provided to both radio IC 310 and radio IC 330, and may represent a clock source that is provided for data timers 320 and 332, and may further represent a universal time base clock, such as a time base provided by a GPS or the like. The communication interface represents any data communication interface as needed or desired, including a processing system-level data communication interface, such as a PCIe interface, a USB interface, a proprietary processing system-level interface, or the like, an area-level data communication interface, such as a LAN or WAN interface like Ethernet or FibreChannel interfaces, wireless interfaces, or the like, or any other type of data communication interface capable of transmitting the timing information as described herein, such as network packets, bus transactions, bit-streams, or the like. As used herein, clock edge distance counter module 316 and clock edge reconstruction module 336 may represent hardware signal processing devices, software signal processing applications, or a combination of hardware and software, as needed or desired.

Figure 4:
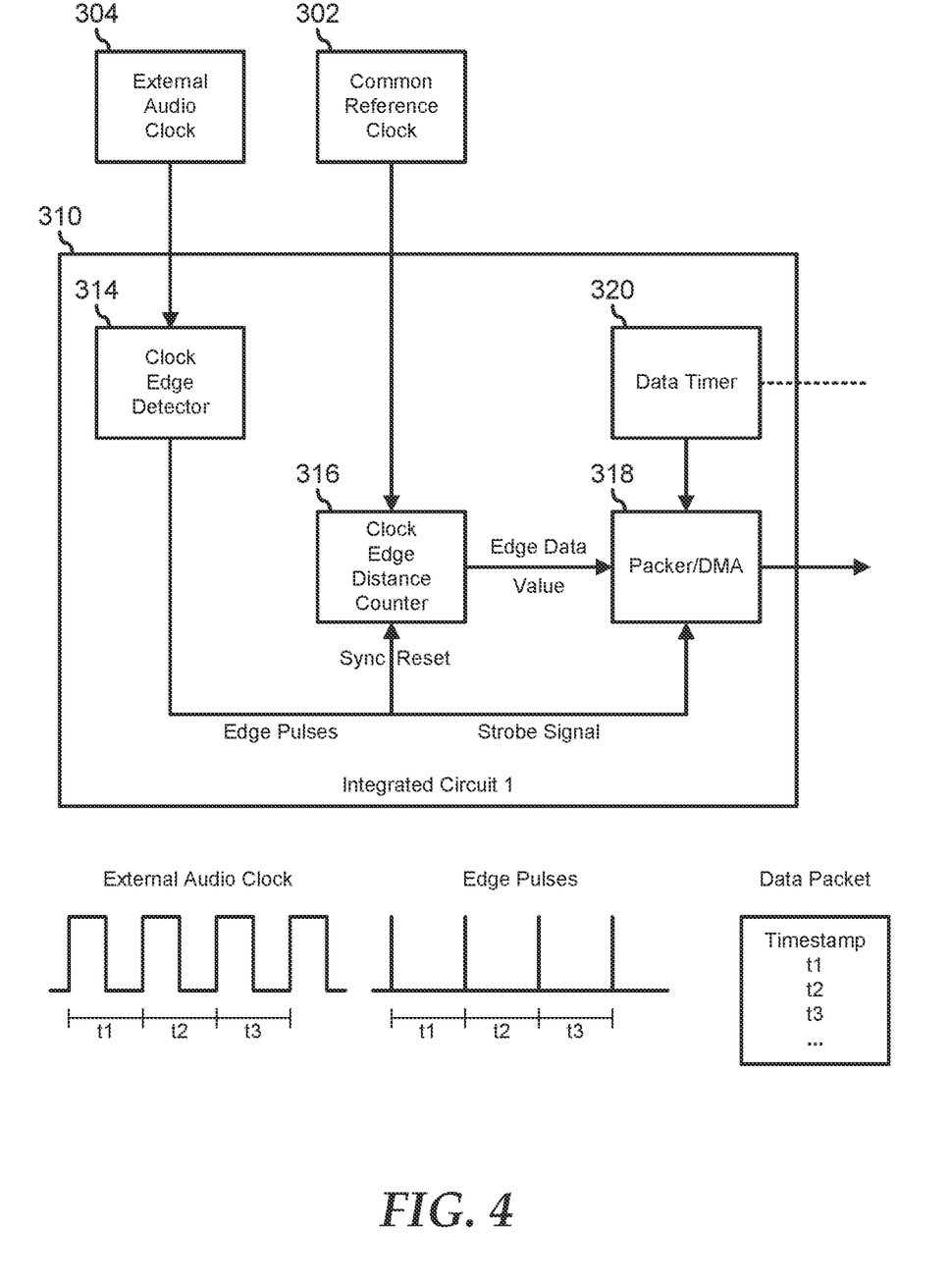
FIG. 4 is a block diagram illustrating a first radio IC of the system of FIG. 3.

FIG. 4 illustrates the operation of radio IC 310 in determining the timing information and providing the timing information to the communication interface. Here, external audio clock 304 is provided to clock edge detector module 314, as illustrated. Clock edge detector module 314 detects the rising edges of external audio clock 304 and provides a sequence of edge pulses to clock edge distance counter module 316. Here, the edge pulses operate as a synchronization reset for clock edge distance counter module 316. Here, when clock edge distance counter module 316 receives an edge pulse, a counter of clock edge distance counter module 316 is reset, and the clock edge distance counter module begins to count up the number of cycles of common reference clock 302 until a next edge pulse is received. When the next edge pulse is received, the counter is reset for the next count, and the value of the counter is provided to data packer 318. Data packer 318 also receives the edge pulses as a strobe signal for receiving the counter value. In this regard, in a particular embodiment, clock edge distance counter module 316 may be implemented simply as an up-counter whose output is provided directly to data packer 318, and the data packer can operate to latch the value from the counter when on each edge pulse. Data packer 318 then provides the timing information on the communication interface, as needed or desired. An exemplary data packet is shown where timestamp information is provided, and also, multiple counter values are provided in a single data packet. In this way, the data bandwidth of the communication interface can be used sparingly, because any data overhead associated with a data packet on the communication interface can be utilized for multiple count values, rather than being provided for multiple data packets.

Figure 5:
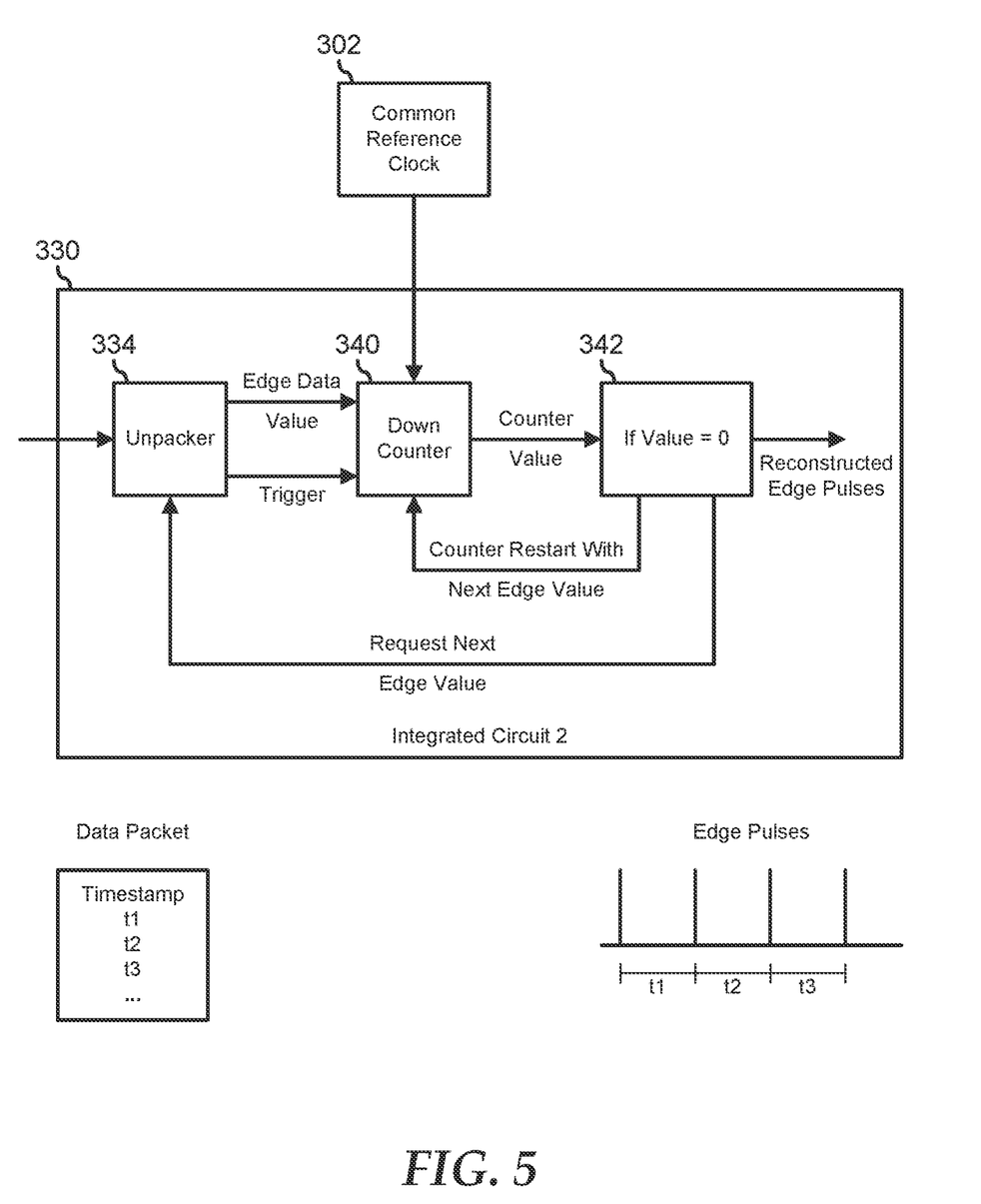
FIG. 5 is a block diagram illustrating a second radio IC of the system of FIG. 3.

FIG. 5 illustrates the operation of radio IC 330 in recreating the edge pulses from the timing information received from the communication interface. Here, data unpacker 334 receives the timing information from the communication interface, and provides the counter value to a down-counter 340. Down-counter 340 provides counts down the number of cycles of common reference clock 302, and provides the current value of the down-counter to a decision module 342. Decision module 342 determines when the value of down-counter 340 is equal to zero. When the value of down-counter 340 is equal to zero, the decision module provides an edge pulse output, sends a counter restart signal to down-counter 340 to receive a new count value from data unpacker 334, and provides a signal to the data unpacker to provide the next count value to the down-counter.

In a particular embodiment, an audio PLL similar to audio PLL 338 may be configured to receive the timing information directly, and to generate the PLL signal. It will be understood that one or more additional radio IC may be provided with the timing information, and thereby three or more radio ICs may have their audio PLLs synchronized to each other, as needed or desired. It will be understood that the teachings of the current embodiments for edge detection, edge counting, and the like, may be understood as a type of data compression. As such, various compression techniques should not be understood as being incompatible with the teachings of the current embodiments. For example, if counter values are limited to a discrete number of different values over a predetermined time period, such arithmetical encoding and compression methods (e.g., Huffman encoding or the like) may be employed to reduce the bandwidth of the data stream.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A system, comprising:
a first integrated circuit device;
a second integrated circuit device; and
a reference clock provided to the first integrated circuit device and the second integrated circuit device; and
wherein:
the first integrated circuit device is configured to detect a first edge of a first clock utilized by the first integrated circuit device, to detect a second edge of the first clock, to determine a first count of cycles of the reference clock between the first edge and the second edge, and to communicate the first count to the second integrated circuit device; and
the second integrated circuit device is configured to receive the first count, to provide a third edge of a second clock utilized by the second integrated circuit device, to determine that a first number of cycles of the reference clock since providing the third edge is equal to the first count, and to provide a fourth edge of the second clock in response to determining that the first number of cycles is equal to the first count.

2. The system of claim 1, wherein:
the first integrated circuit device is further configured to detect a fifth edge of the first clock, to determine a second count of cycle of the reference clock between the second edge and the fifth edge, and to communicate the second count to the second integrated circuit device; and
the second integrated circuit device is further configured to receive the second count, to determine that a second number of cycles of the reference clock since providing the fourth edge is equal to the second count, and to provide a sixth edge of the second clock in response to determining that the second number of cycles is equal to the second count.

3. The system of claim 1, wherein:
the first integrated circuit device is further configured to detect a fifth edge of the first clock, to determine a second count of cycle of the reference clock between the second edge and the fifth edge, and to communicate a difference between the first count and the second count to the second integrated circuit device; and
the second integrated circuit device is further configured to receive the difference, to determine that a third number of cycles of the reference clock since providing the fourth edge has elapsed, and to provide a sixth edge of the second clock in response to determining that the third number of cycles has elapsed, wherein the third number of cycles is determined based upon the first count and the difference.

4. The system of claim 1, wherein the second integrated circuit device is further configured to determine that a second number of cycles of the reference clock since providing the fourth edge is equal to the first count, and to provide a fifth edge of the second clock in response to determining that the second number of cycles is equal to the first count.

5. The system of claim 1, further comprising:
a third integrated circuit device;
wherein:
the first integrated circuit device is further configured to communicate the first count to the third integrated circuit device; and
the third integrated circuit device is configured to receive the first count, to provide a fifth edge of a third clock utilized by the third integrated circuit device, to determine that the first number of cycles is equal to the first count, and to provide a sixth edge of the third clock in response to determining that the first number of cycles is equal to the first count.

6. The system of claim 1, wherein:
the first integrated circuit device is further configured to determine a timestamp of the first edge, wherein the timestamp is based upon the reference clock, and to communicate the timestamp to the second integrated circuit device; and the second integrated circuit device is further configured to receive the timestamp, and, in providing the third edge, to provide the third edge based upon the timestamp.

7. The system of claim 1, wherein the first edge has a first orientation.

8. The system of claim 7, wherein the second edge has the first orientation.

9. The system of claim 7, wherein the second edge has a second orientation opposite to the first orientation.

10. The system of claim 1, further comprising:
a communication interface between the first integrated circuit device and the second integrated circuit device, wherein the first count is communicated to the second integrated circuit device via the communication interface.

11. A method, comprising:
detecting, by a first integrated circuit device of a system, a first edge of a first clock utilized by the first integrated circuit device;
detecting, by the first integrated circuit device, a second edge of the first clock;
determining a first count of cycles of a reference clock between the first edge and the second edge;
communicating the first count to a second integrated circuit device receiving, by the second integrated circuit device, the first count;
providing, by the second integrated circuit device, a third edge of a second clock utilized by the second integrated circuit device;
determining, by the second integrated circuit device, that a first number of cycles of the reference clock since providing the third edge is equal to the first count; and
providing, by the second integrated circuit device, a fourth edge of the second clock in response to determining that the first number of cycles is equal to the first count.

12. The method of claim 11, wherein:
detecting, by the first integrated circuit device, a fifth edge of the first clock;
determining a second count of cycle of the reference clock between the second edge and the fifth edge;
communicating the second count to the second integrated circuit device;
receiving, by the second integrated circuit device, the second count;
determining, by the second integrated circuit device, that a second number of cycles of the reference clock since providing the fourth edge is equal to the second count; and
providing, by the second integrated circuit device, a sixth edge of the second clock in response to determining that the second number of cycles is equal to the second count.

13. The method of claim 11, wherein:
detecting, by the first integrated circuit device, a fifth edge of the first clock;
determining a second count of cycle of the reference clock between the second edge and the fifth edge;
communicating a difference between the first count and the second count to the second integrated circuit device;

receiving, by the second integrated circuit device, the difference;
determining that a third number of cycles of the reference clock since providing the fourth edge has elapsed, wherein the third number of cycles is determined based upon the first count and the difference; and
providing a sixth edge of the second clock in response to determining that the third number of cycles has elapsed.

14. The method of claim 11, further comprising:
determining, by the second integrated circuit device, that a second number of cycles of the reference clock since providing the fourth edge is equal to the first count; and
providing a fifth edge of the second clock in response to determining that the second number of cycles is equal to the first count.

15. The method of claim 11, further comprising:
communicating the first count to a third integrated circuit device; and
receiving, by the third integrated circuit device, the first count;
providing, by the third integrated circuit device, a fifth edge of a third clock utilized by the third integrated circuit device;
determining, by the third integrated circuit device, that the first number of cycles of the reference clock since providing the fifth edge is equal to the first count; and
providing, by the third integrated circuit device, a sixth edge of the third clock in response to determining that the first number of cycles is equal to the first count.

16. The method of claim 11, further comprising:
determining, by the first integrated circuit device, a timestamp of the first edge, wherein the timestamp is based upon the reference clock;
communicating the timestamp to the second integrated circuit device;
receiving, by the second integrated circuit device, the timestamp; and
in providing the third edge, providing, by the second integrated circuit device, the third edge based upon the timestamp.

17. The method of claim 11, wherein the first edge has a first orientation.

18. The method of claim 17, wherein the second edge has the first orientation.

19. The method of claim 16, wherein the second edge has a second orientation opposite to the first orientation.

20. A method for synchronizing clocks in integrated circuit devices, the method comprising:
oversampling, in a first integrated circuit device, a first clock;
providing, via a communication interface between the first integrated circuit device and a second integrated circuit device, a bit stream that includes information from the oversampling; and
playing back, in the second integrated circuit device, a second clock based upon the information from the oversampling.

* * * * *